United States Patent [19]

Endo et al.

[11] Patent Number: 4,502,034

[45] Date of Patent: Feb. 26, 1985

[54] ELECTRIC COMPONENT

[75] Inventors: Satsuo Endo, Ishinomaki; Massaru Saito, Miyagi; Yoshihiro Ohashi, Miyagi, All of Japan

[73] Assignee: Alps Electric Co., Ltd., Tokyo, Japan

[21] Appl. No.: 524,787

[22] Filed: Aug. 19, 1983

[30] Foreign Application Priority Data

Aug. 25, 1982 [JP] Japan ................... 57-146185
Oct. 18, 1982 [JP] Japan ................... 57-181443

[51] Int. Cl.$^3$ .................................. H01C 10/16
[52] U.S. Cl. .................. 338/128; 264/242; 338/197; 338/334
[58] Field of Search .......... 338/128, 203, 197, 198, 338/200; 264/242, 264; 29/610 R

[56] References Cited

U.S. PATENT DOCUMENTS

| 2,866,054 | 12/1958 | Purdy | 338/197 X |
| 2,871,324 | 1/1959 | Budd | 338/128 |
| 3,386,068 | 5/1968 | Filliette et al. | 338/128 |
| 4,158,450 | 6/1979 | Luzuki | 264/242 X |
| 4,334,352 | 6/1982 | Van Benthuysen | 29/610 R X |

Primary Examiner—C. L. Albritton
Attorney, Agent, or Firm—Guy W. Shoup; Gerard F. Dunne

[57] ABSTRACT

An electrical component comprises a holder having shaft holes and a plurality of rotary members each consisting of a shaft portion fitting into a respective shaft hole in the holder. Connection members formed unitarily with the rotary members each connects a rotary member to at east one other rotary members adjacent to it; and break-off portions formed on the connection member are capable of breaking easily from the rotary members when the rotary members are forced to rotate.

12 Claims, 10 Drawing Figures

ELECTRIC COMPONENT

BACKGROUND OF THE INVENTION

This invention relates to an electrical component for use in a variable resistor, a band selector or the like having a rotary member. More particularly, the present invention relates to an electrical components having such a rotary member which can be assembled in a holder more simply.

The miniaturization of electrical components has become necessary in recent years in all fileds, and the tuner of a television receiver is no exception. In the tuner of this kind, a large number of band slection switches and a variable resistor for tuning must be fitted into a single frame. If the size of each component is reduced, the production and assembly becomes complicated, and quality control of the component must be extremely strict.

To cope with this problem, an electrical component which is easy to assemble and product has been proposed, as shown in FIGS. 1 and 2. The electrical component consists of a holder 1 having a plurality of holes 1a for receiving the shafts of respective rotary members 2 rotatably so that they may not be removed from the holder. The method of forming this component comprises clamping the holder 1 provided with the holes 1a between first and second molding dies 3 and 4 in close contact therewith as shown in FIG. 2, packing a thermoplastic synthetic resin material into the cavities of these dies 3 and 4 and curing the resin material so as to form the rotary members 2 in place within the holes 1a of the holder 1. Since the rotary members 2 shrink during cooling and curing, a gap occurs between them and the holes 1a of the holder 1 so that the rotary members are rotatable within the holder 1 but held to the holder by a shaft portion 2a that is tapered so as to correspond to the tapered hole 1a. This method can eliminate the necessity of assembling a plurality of rotary members 2 into the holder 1 one by one and can simplify assembly and production.

Even though the electrical component is thus improved, it has a construction which permits a plurality of rotary members 2 to rotate in independent directions after the component is assembled. When a knob (not shown) and a slider receptaacle (not shown) are fitted onto an operating portion 2b and a driving portion 2c, respectively, of each rotary member 2 when the electrical component is used as a band selector switch, for example, the orientations of the knob and the slider receptacle must be located so as to correspond to the rotational orientation of each rotary member 2 and this is extremely troublesome and difficult to automate.

SUMMARY OF THE INVENTION

It is therefore an object of the present invention to provide an electrical component which facilitates the fitting of a slider receptacle or the like, and makes it possible to automate the fitting work by connecting a rotary member to at least one adjacent rotary member by a connecting member, which is removed when the rotary member is forced to rotate, to fix the rotary member temporarily at the locating position when a band selector switch or the like is being fitted.

Hereinafter, the present invention will be described with reference to the accompanying drawings.

BRIEF DESCRIPTION OF THE DRAWINGS

FIGS. 1 and 2 show a prior art device in which,

FIG. 1 is a section of the electrical component;

FIG. 2 is a section showing the method of shaping the electrical component;

FIG. 4(a) shows the state before the break-off portions are broken off;

FIG. 4(b) shows the state after the break-off portions have been broken off;

FIGS. 7 through 9 show a tuning block using the electrical component in accordance with the present invention in which:

FIG. 7 is a plan view of the tuning block;

FIG. 8 is a side view of the tuning block of FIG. 7; and

FIG. 9 is a partial plan view of the variable resistor fittend into the insulating substrate of the tuning block.

DESCRIPTION OF THE PREFERRED EMODIMENT

Figure 1:
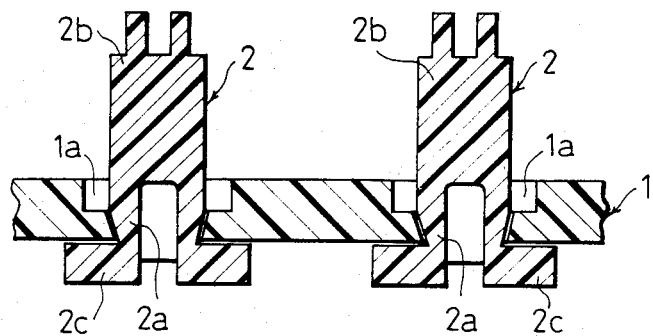
Figure 2:
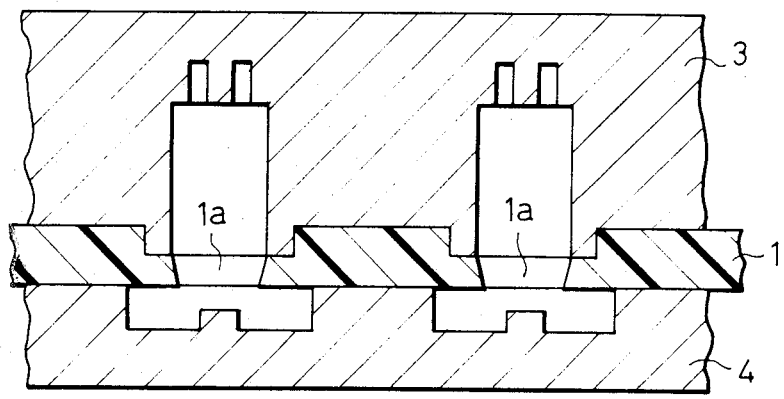
Figure 3:
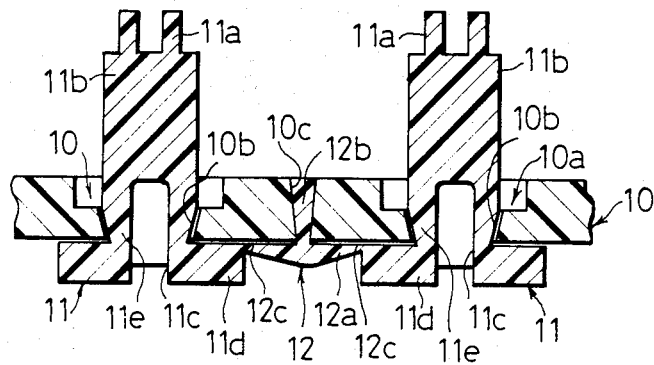
FIG. 3 is a section of the electrical component when used as a band selector switch.
Figure 4A:
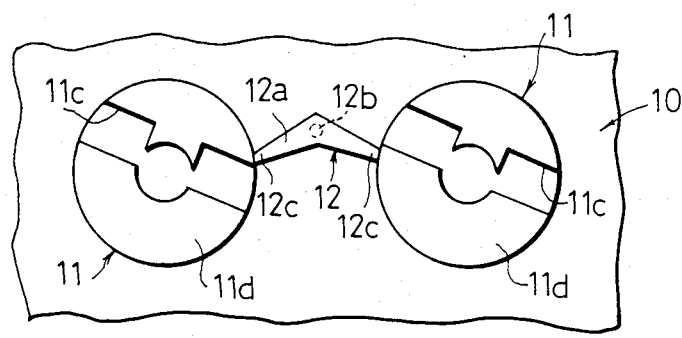
FIGS. 4(a) and 4(b) are base views of the electrical component.
Figure 4B:
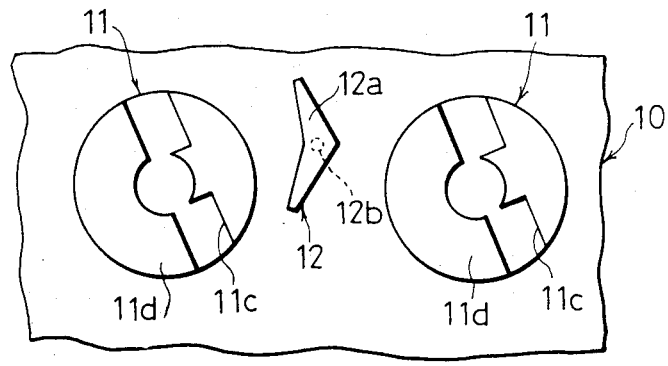

FIGS. 3 through 6 show one embodiment of the present invention which includes a holer 10 serving as a stator portion or a frame into which a plurality of rotary members 11 of respective band selector switches, for exampel, are incorporated. The holder 10 is molded from a thermoplastic synthetic resin such as polyelthylene terephthalate and has shaft holes 10a into which each rotary member is assembled. Each shaft hole 10a has a step portion forming a reduced diameter portion 10b tapering as shown. Each rotary member 11 includes an operating poriton 11b having a fitting portion 11a onto which an operation knob, not shown, can be fitted, a fitting portion 11c into which a slider receptacle 26 (described belwo) can be fitted, a driving portion 11d having a diameter greater than that of the shaft hole 10a, and a shaft portion 11e connecting the driving portion 11d to the operation portion 11b and extending into the shaft hole 10a. The shaft portion 11e is tapered in a manner so as to correspond to the tapered portion 10b of the shaft hole 10a with a small gap therebetween. Because the shaft portion 11e engages with the tapered poriton 10b of the shaft hole 10a, the rotary member 11 is prevented from falling through the hole 10a.

Each rotary member is connected to an adjacent rotary member by a connection member 12 which can be broken off readily when the rotary members are forced to rotate. Each connection member 12 includes a connecting portion 12a which is connected to an adjacent pair of rotary members 11 via break-off poritons 12c, and a holding poiton 12b having a tapered shaft fitting within a correspondingly tapered hole 10c to prevent the connecting member from falling through the respective hole even when the break-off portions 12c are separated from the rotary members 11. The break-off portions 12c have a reduced thickness and width, and are formed at opposing ends of the connecting portion 12a. As shown, for example, in FIG. 4(a), the break-off portions are connected to the driving portions 11d of the adjacent rotary members 11. The connection member 12 and the rotary members 11 are molded integrally from a thermoplastic synthetic resin such as polyacetal.

Figure 5:
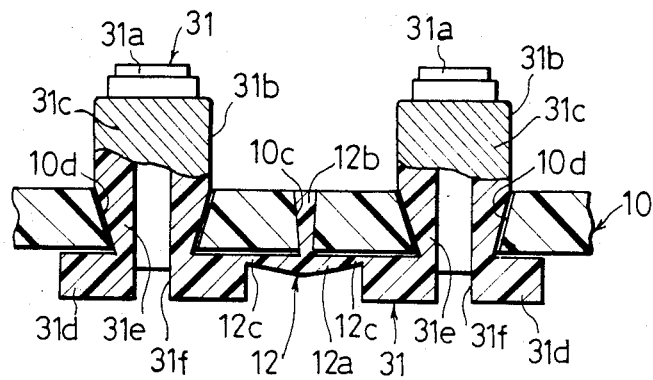
FIG. 5 is a section of the electrical component when used as a variable resistor.

In the electrical component shown in FIG. 5, a rotary member 31 is designed as a variable resistor, for example, and is fitted into a conical shaft hole 10d of the holder 10. Two adjacent rotary members are connected by a connection member 12 analogous to the connection member of the embodiment described above. A pointer 31a is formed on the upper surface of the operating portion 31b of each rotary member 31 while teeth 31c are formed around the circumference thereof. A shaft portion 31e, which is interposed between the operating portion 31b, and a driving portion 31d is shaped conically so as to correspond to the shape of the shaft hole 10d.

Figure 6:
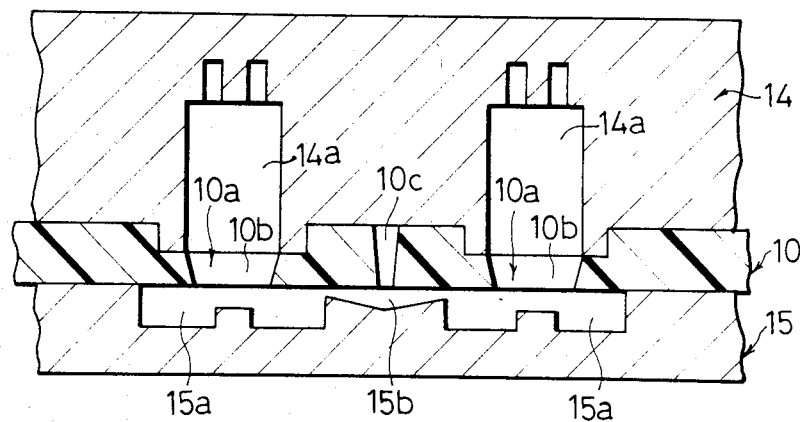
FIG. 6 is a section showing the method of shaping the electrical component of FIG. 3.

Next, the method of molding the electrical compoents in accordance with the present invention will be explained with reference to FIG. 6.

First, the holder 10 made of a thermoplastic synthetic resin such as polyethylene terephthalate and equipped with a plurality of shaft holes 10a and holding holes 10c is clamped closely between first and second molidng dies 14 and 15. The first molding die 14 has cavities 14a therein for forming the operating portions 11b of the rotary members 11, and the second molding die 15 has cavities 15a and 15b for forming the driving portions 11d of the rotary members 11 and the connecting portion 12a of the connection member 12, respectively. A thermoplastic synthetic resin such as polyacetal is injected through a gate, not shown, in the second molding die 15 into the cavities 14a, 15a and 15b of the two dies and into the holding hole 10c, and is cooled and cured. It is of the utmost importance that the hlder 10 be molded and cured before the molding of the rotary members 11 because the synthetic resin materials forming these members 10 and 11 are different, the melting point of the material forming the holder 10, for example, is somewhat higher than that of the material forming the rotary members 11. Accordingly, no integration due to fusing will occur at the boundaries between these two molding materials. If the surface of the holder 10, for example, is made smooth, catching of the resin of the rotary members onto the boundarey surface can be prevented even if the same kind of molding material is used, and the rotary members 11 can be supported rotatably by the holder 10.

Because the thermoplastic synthetic resin shrinks due to its colling and curing, the shaft portions 11e of the rotary members 11 and the holder 10 are separated slightly from each other, and two adjacent rotary members 11 are located at their predetermined positions by the connection member 12 and are molded together integrally. A plurality of groups each consisting of two rotary members 11 with a connection member 12 therebetween are molded simultaneously, forming the electrical component in accordance with the present invention. The rotary members 31 for variable resistors can be formed in the same way as above.

Figure 7:
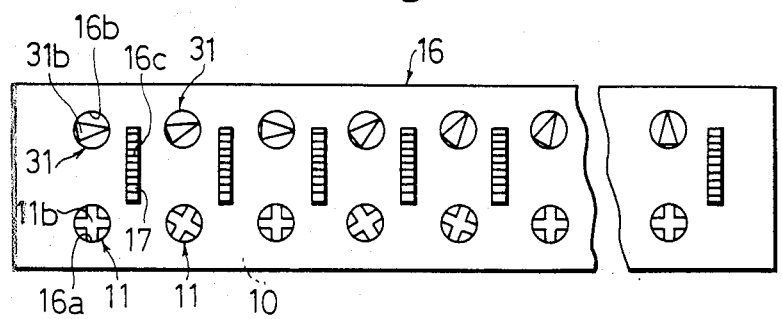
Figure 8:
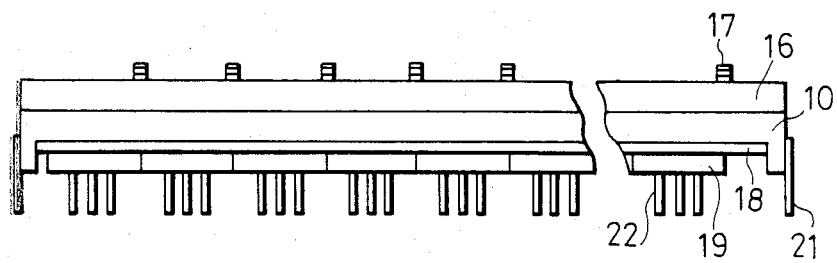

Another embodiment of the present invention, in which the electrical component thus formed is applied to a tuning block, will now be explained with reference to FIGS. 7 thorugh 9. FIG. 7 is a plan view of this tuning block. As depicted in the drawing, rotary members 11 for band switching and rotary members for variable resistors 31 are juxtaposed, their operation portions 11b and 31b project rotatably from round holes 16a and 16b in an insulating case 16. The rotary members are each located and fixed by connection members 12 to a single holder 10 fitted to the rear side of the insulating case. Thumb wheels 17 for rotting the rotary members 31 acting as variable resistors project from elongated square holes 16c in the insulating case 16, and one each of the thumb wheel 17, band switching rotary members 11, and rotary members 31 for a variable resistor form one group. A plurality of thes groups are juxtaposed in the longitudinal direction.

Figure 9:
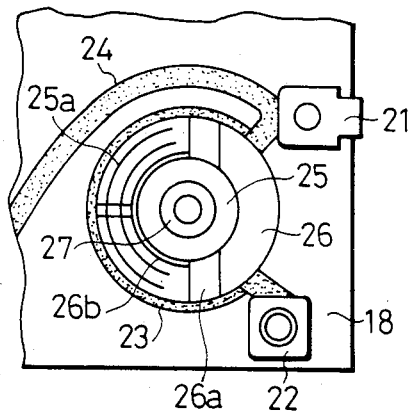

An insulating substrate 18 having terminals 21 and 22 supported by terminal supports 19 is fitted below the holder 10 as can be seen in the drawings. Contact circuits (not shown) for band switching correspond to the rotary members 11 and 31, and resistor circuits 23 (see FIG. 9) for the variable resistors are formed by printing on the upper surface of the insulating substrate 18. Each resistor circuit 23 is connected to the terminals 21, 22 and a plurality of resistor circuits 23 are connected mutually by conductive portions 24. A slide 25 having a contact plate 25a which comes into sliding contact with one of these resistor circuits 23 is fixed into a slide receptacle 26 having a pair of engagement protuberances 26a and a holding poriton 26b, and the slider receptacle 26 as well as the slider 25 are caulked rotatably into the insulating substrate 18 by eyelets 27. Each engagement protuberance 26a of the slider receptacles 26 is fitted into a recessed fitting portion 31f of the driving portions 31d of the rotary members 31, and a slider receptacle associated with the contact circuit for bandswitching is similarly fitted to each fitting portion 11c of the driving portions 11d of the other kind of rotary members 11. Knobs, not shown, are attached to the fitting portions 11a of the operating portions 11b of the band switching rotary members 11, thus completing the initial assembly of the tuning block. The rotary members 31 and the rotary members 11 are forced to rotate by rotating the thumb wheels 17 and the knobs, respectively, so as to break them away from the break off portions 123c of the connection memmbers 12. The assembly of the tuning block is completed by thus rotating both kinds of rotary members 11, 31.

During the fitting the rotary members 11, 31 to the slider receptacles 26 and fitting the knobs, both kinds of rotary members 11, 31 are located at predetermined positions and fixed temporarily by the connection members 12 so that the rotary members 11, 31 are not oriented in mutually different rotational positions. In the prior art device, the rotary members 2 can turn while being assembled, so that a plurality of rotary mewmbers 2 may rotate to different orientations. In accordance with the present invention, however, the slider receptacles 26 and the knobs can be fitted together to a plurality of rotary members 11, 31 if the receptacles and the knobs are set in advance at predetermined orientations. This makes automation feasible. When the conenction members 12 are broken off by the forced rotation of the rotary members, the connection portions 12a do not scatter or exert any adverse influences because they are supported by the holding portions 12b held by the holder 10. Since the connection members 12 are made rotatable, the rotary members 11, 31 can rotate withut meeting any resistance from the connection members 12 even if they come into contact with burrs protruding from the connection members 12 which may be formed when the break-off portions 12c are broken off. When the holder is used after it is assembled, the rotary members 11, 31 do not come into contact with the connection members 12 and do not meet any resistance from the connection members during their rotation if the center of mass of each connection member is separated from its axis of rotation, and an arrangement is made wherein the connection members 12 come to a halt in the orientations shown in FIG. 4(b), that is, at orientations in which the connecting portions 12a are separated from the rotary members 11, 31.

When the thumb wheels 17 of the tuning block thus assembled are rotated, the rotary members 31 rotate and rotate to turn the slider receptacles 26, so that the contact plates 25a slide along the resistor circuits 23 to adjust the resistances. When the knobs are rotated, on the other hand, the rotary members all are rotated thereby changing the bands.

The electrical compoent in accordance with the present invention is not particularly limited to the tuning block of the embodiment described above, but can of course be applied to discrete components such as variable resistors, band selection switches and so forth. The holder can be replaced by an insulating cover, and the number of rotary members 11, 31 connected by a connection member 12 is not in any way limited to two as in the foregoing embodiment, thereby may of course be three or more. Hence, the electrical components of the present invention has an extremely wide range of applications.

As described above, the present invention can locate a plurality of rotary members by connecting at least two rotary members by a single connection member, and makes it possible to fit slider receptacles, etc., automatically and at the same time. Hence, the present invention provides the effect that a component such as a tuning block can be assembled easily.

What is claimed is:

1. An electric component comprising
   a holder having shaft holes;
   a plurality of rotary members, each consisting of a shaft portion fitting into a respective one of said shaft holes of said holder, an operation portion formed integrally with said shaft portion, and a driving portion;
   a connection member for connecting each of said rotary members to at least one other rotary member adjacent to said rotary member; and a break-off portion formed on said connection member, capable of breaking easily when each of said rotary members is forced to rotate; each of said rotary members becoming rotatable with respect to said holder when said break-off portion breaks off; wherein said connection member consists of a connecting portion connecting said rotary members with each other via break-off portions, and a holding portion embedded into said holder and preventing said connecting portion from falling off even when said connecting portions are broken off from said rotary members.

2. The electrical component as defined in claim 1 wherein said holder and said rotary member are made of different synthetic resins.

3. The electrical component as defined in claim 1 wherein said driving portion of said rotary member is fitted into a slider receptacle of a band selection switch.

4. The electrical component as defined in claim 1 wherein a tapered portion is formed in said shaft hole of said holder.

5. The electrical component as defined in claim 1 wherein said connecting portion is made to be stationary at a position spaced apart from said rotary member when said break-off portion is broken.

6. The electrical component as defined in claim 1 wherein said connection member has its center of mass at a position spaced apart from the axis of its rotational center.

7. In an electric component having a plurality of rotatable shafts fitted rotatably within corresponding holes of a holder, said rotatable shafts each being formed of a synthetic resin material molded in place within the respective holes of said holder, the imporvement wherein said rotatable shafts are formed unitarily with connecting members molded into said holder for retention thereby and having break-off portions connecting adjacent rotatable shafts and adapted to be separated therefrom upon the initial rotation of said shafts for holding said shafts in position during assembly.

8. An electric component according to claim 7, said connecting members each having a shaft portion held rotatably within respective openings in said holder.

9. An electric components accoding to claim 8, said openings being conical and said shaft portions being tapered correspondinggly to be held rotatably therein.

10. An electric component according to claim 7, said holder being formed of synthetic resin having a melting temperature higher than that of the resin used for said rotatable shafts and said connecting members.

11. An electric component according to claim 7, said connecting members each being adapted to rotate to a position spaced away from the respective rotatable shafts upon being separated therefrom.

12. An electric component according to claim 8, said connecting members each having its center of mass offset from its axis of rotation.

* * * * *